United States Patent [19]
Cronin et al.

[11] Patent Number: 5,292,689
[45] Date of Patent: Mar. 8, 1994

[54] METHOD FOR PLANARIZING SEMICONDUCTOR STRUCTURE USING SUBMINIMUM FEATURES

[75] Inventors: John E. Cronin, Milton; Howard S. Landis, Underhill, both of Vt.

[73] Assignee: International Business Machines Corporation, Armonk, N.Y.

[21] Appl. No.: 940,427

[22] Filed: Sep. 4, 1992

[51] Int. Cl.$^5$ .......................................... H01L 21/465
[52] U.S. Cl. ...................................... 437/228; 437/67; 437/78; 437/90
[58] Field of Search .................. 437/28, 67, 225, 78, 437/90; 156/643, 644, 653, 659.1

[56] References Cited

U.S. PATENT DOCUMENTS

| | | | |
|---|---|---|---|
| 4,211,582 | 7/1980 | Horng et al. | 148/1.5 |
| 4,407,695 | 10/1983 | Deckman et al. | 156/643 |
| 4,493,740 | 1/1985 | Komeda | 148/187 |
| 4,576,834 | 3/1986 | Sobezak | 156/653 |
| 4,671,851 | 6/1987 | Beyer et al. | 156/645 |
| 4,753,901 | 6/1988 | Ellsworth et al. | 437/67 |
| 4,789,648 | 12/1988 | Chow et al. | 437/225 |
| 4,803,181 | 2/1989 | Buchmann et al. | 437/228 |
| 4,810,669 | 3/1989 | Kobayashi | 437/67 |
| 4,879,257 | 11/1989 | Patrick | 437/195 |
| 4,916,087 | 4/1990 | Tateoka et al. | 437/67 |
| 5,137,837 | 8/1992 | Chang et al. | 437/21 |

OTHER PUBLICATIONS

A. Schiltz and M. Pons, J. Electrochem, Soc. 133:178-181 (1986).
W. M. Goubau, IBM Technical Disclosure Bulletin, vol. 26, No. 10A, p. 4995 (1984).

Primary Examiner—Olik Chaudhuri
Assistant Examiner—H. Jey Tsai
Attorney, Agent, or Firm—Heslin & Rothenberg

[57] ABSTRACT

The invention provides a method for planarizing over a recessed area of a semiconductor structure. The method involves the creation of a series of subminimum (i.e. 50 to 500 Angstroms thick) silicon pillars extending vertically upward from the base of a wide trench, and oxidizing the pillars. When the substrate is covered with a conformal CVD oxide, the pillars prevent the formation of a single deep depression above the trench.

21 Claims, 10 Drawing Sheets

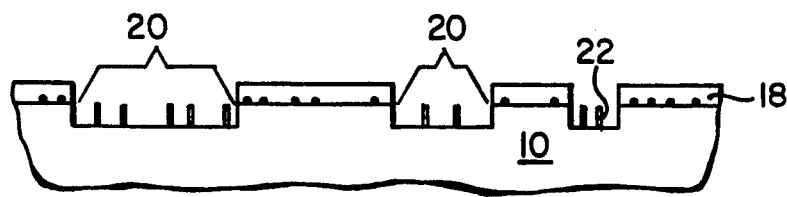
FIG. IF
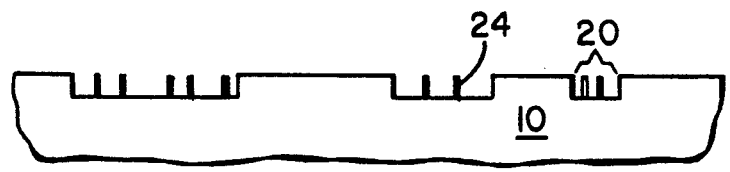
FIG. IG
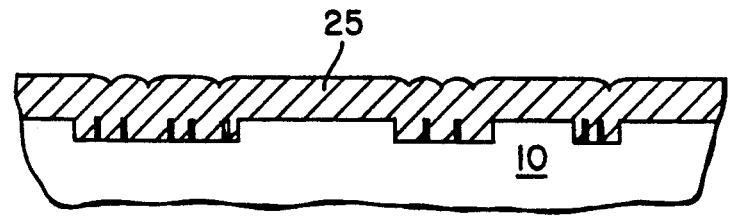
FIG. IH
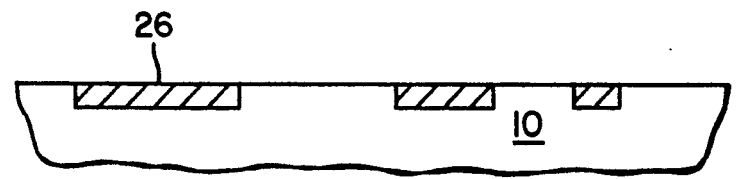
FIG. II

METHOD FOR PLANARIZING SEMICONDUCTOR STRUCTURE USING SUBMINIMUM FEATURES

TECHNICAL FIELD

This invention relates to a method for planarizing over a recessed area of a semiconductor structure. More specifically, the invention relates to the use of spaced subminimum features to prevent severe depression of a planarization layer when the layer is applied and then planarized over a recessed area on a semiconductor structure.

BACKGROUND ART

Relatively complex planarization procedures are often required in the formation of devices having relatively wide trenches due to the fact that film material deposited by conventional chemical vapor deposition (CVD) processes typically covers the depression conformally, thus replicating the depression's non-planar structure.

Horng et al. in U.S. Pat. No. 4,211,582, issued Jul. 8, 1980, disclose relatively narrow silicon mesas in a relatively wide trench. These mesas are completely oxidized after formation. However, Horng et al. do not suggest that such mesas may be used in conjunction with the deposition of a conformal CVD oxide so as to prevent the formation of a relatively deep depression overlying the trench.

Schiltz and Pons ["Two-Layer Planarization Process", J. Electrochem. Soc. 133:178-181 (1986)] disclose the use of a plurality of vertically extending fingers in a trench which increase the distance the top surface of a conformal coating overlying the vertical fingers is spaced from the base of the trench. Schiltz and Pons do not suggest the use of such vertical finger structures as a means for avoiding the formation of a unitary deep depression in an oxide film overlying a wide trench.

A need thus exists for a method for planarizing over a recessed area of a semiconductor structure.

DISCLOSURE OF INVENTION

It is thus an object of the invention to provide a method for planarizing over a recessed area of a semiconductor structure.

In furtherance of this objective, the present invention is directed to a method of planarizing over a recessed area of a semiconductor structure. The method involves the creation of a series of subminimum (i.e. 50 to 500 Angstroms thick) silicon pillars extending vertically upward from the base of a wide trench, and oxidizing the pillars. When the substrate is covered with a conformal CVD oxide, the pillars prevent the formation of a single deep depression above the trench. Instead, a series of relatively shallow depressions (positioned between the silicon pillars) are formed, with the depth of such shallow depressions being significantly less than that of the single large depression that would have occurred had the silicon pillars not been provided. The resultant surface is easier to planarize.

By use of the appropriate subminimum features in the trenches, an improved structure can be obtained after filling with a conformal deposition. The important advantages of this invention are: 1) Essentially planar structures result after filling trenches with conformal films, which allow improved planarization without additional complex processing. 2) Features of different depth and width (on the same chip) can be filled with the same (short) CVD depositions, while still maintaining planarity. The thickness of fill material required is determined by the spacing of the subminimum features in the trench, not by the width or depth of the trench. 3) No additional masks are necessary if a "random" set of features are placed in the trenches (see Examples 1-3). 4) With one additional mask (see Example 4), a controlled set of subminimum features can be placed in the trenches.

BRIEF DESCRIPTION OF DRAWINGS

The foregoing and other objects, features and advantages of the invention will be apparent from the following more particular description of preferred embodiments of the invention as illustrated in the accompanying drawings in which:

FIG. 1A–1I are cross-section side elevational views of the planarization process according to one embodiment of the subject invention;

BEST MODE FOR CARRYING OUT THE INVENTION

As mentioned previously, the broad concept of the subject invention is directed to a method of planarizing over a recessed area of a semiconductor structure. This is accomplished utilizing spaced subminimum features, such as silicon pillars.

EXAMPLE 1

Referring to FIG. 1, there is shown one embodiment of the planarization process of the subject invention. A silicon substrate 10 is provided which has a layer of pad oxide 12, or nitride, thereon (see FIG. 1A). The pad oxide 12 remains from deep trench processing. Initially, the pad oxide 12 is removed leaving the silicon substrate 10 exposed (see FIG. 1B). A dilute solution 14 of oxide particles 16 in an appropriate solvent is spun onto the exposed silicon substrate 10 (see FIG. 1C). An appropriate solvent, for example, is methanol. The solute concentration and spin speed should be chosen to leave on the order of one to ten oxide particles per square micron of wafer surface (silicon substrate). The optimum oxide particle size should be between 50 and 500 Angstroms in diameter.

Figure 1A:
Figure 1B:
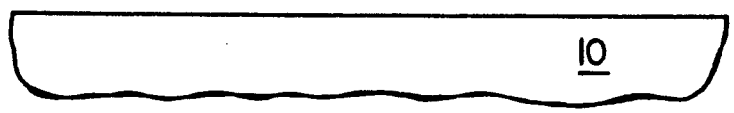
Figure 1C:
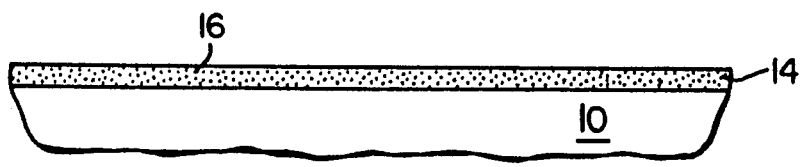
Figure 1D:
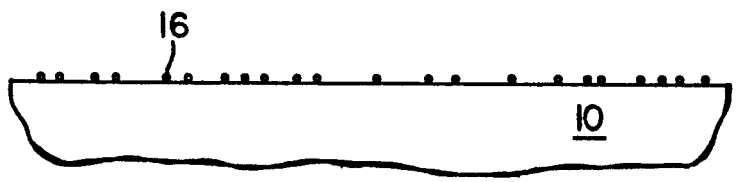

As shown in FIG. 1D, the solvent is then allowed to evaporate. This leaves the oxide particles 16 randomly dispersed over the surface of the silicon substrate 10. An organic binder may be added to the oxide/methanol solution to increase the adhesion of the oxide particulates to the substrate, if needed.

Figure 1E:
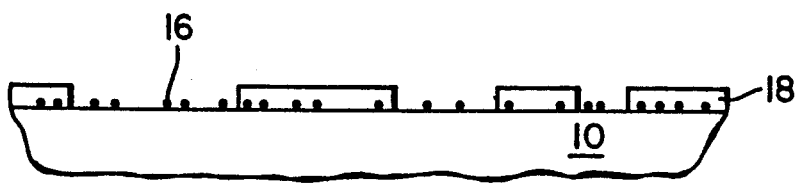

The desired pattern of isolation trenches is then formed using standard resist 18 as a mask as shown in FIG. 1E. The resist 18 is applied, imaged, and developed. The isolation trenches 20 are then etched as shown in FIG. 1F, using a standard deep trench etch. The oxide particles 16 act as micromasks, creating a "bed of nails" of subminimum silicon pillars 22. As long as the trench etch is sufficiently selective for oxide, these silicon pillars 22 will be approximately the diameter of the oxide particles 16 and they will be as tall as the trench is deep.

The silicon pillars are then oxidized (to form oxide pillars 24 as shown in FIG. 1G). As long as they are well dispersed and have small diameters, the pillars can be thermally oxidized. Plasma oxidation is an alternative technique for transforming the silicon pillars into oxide.

As shown in FIG. 1H, the trenches are then filled with a conformal CVD oxide 25. Deposition on the oxide pillars causes "mounds" to form. For appropriate density of oxide pillars (the distance between pillars being about equal to the depth of the trench to be filled), the filled structure can be made to be almost planar before a chemical-mechanical polish (CMP) planarization etchback is performed. For greater pillar densities, the amount of CVD oxide required to fill the structure is reduced, thus reducing the overburden of oxide to be polished and simplifying the CMP process. For a general discussion of chemical-mechanical polishing, see U.S. Pat. No. 4,944,836, issued Jul. 31, 1990 (Beyer et al.) and U.S. Pat. No. 4,910,155, issued Mar. 20, 1990 (Cote et al.).

The resulting deposited conformal CVD oxide is then planarized by appropriate means, e.g. such means being chemical-mechanical polishing (CMP), to form a planarized surface 26 as shown in FIG. 1I. The surface is polished to clear unwanted oxide from the filled trenches. Since the structure was nearly planar immediately after deposition, there is no need for the complex extra masking and etching steps to complete the planarization process that is routinely used. The CMP can be performed with a soft polishing pad (for increased overall polish uniformity) without concern for "dishing" in large field regions. The silicon substrate can be used as a polish stop, provided the electrical characteristics of the silicon are not degraded by the chemical-mechanical polish. Furthermore, because the substructure was transformed into oxide before the deposition of the trench fill, there will be almost no trace left of the silicon "bed of nails" (see FIG. 1I).

EXAMPLE 2

Alternative methods for patterning for trench isolation are also possible. For example, optional patterning steps are shown in FIG. 2. These patterning steps would occur between the steps shown in FIG. 1D and FIG. 1E, and allow more selectivity as to pillar location by forming a field and an array region. Only the field region will contain pillars.

Figure 2A:
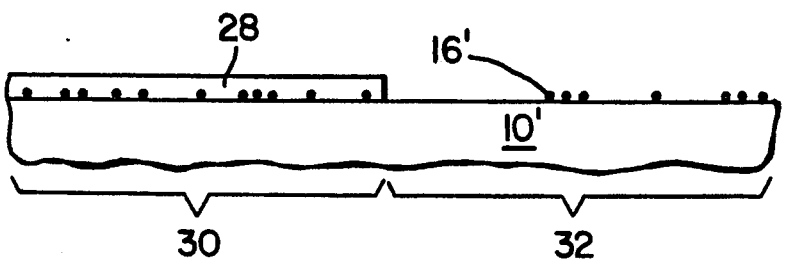
FIG. 2A–2C are cross-section side elevational views of optional patterning steps which can be included in the process shown in FIG. 1A–1I.
Figure 2B:
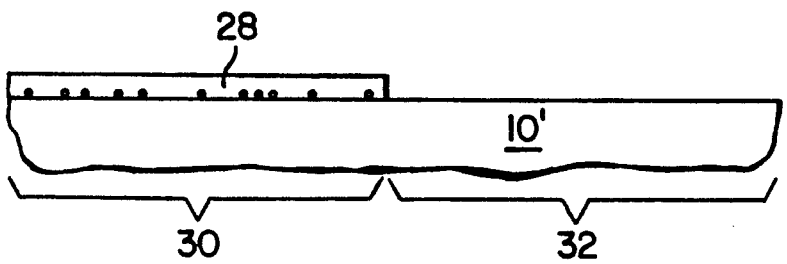
Figure 2C:
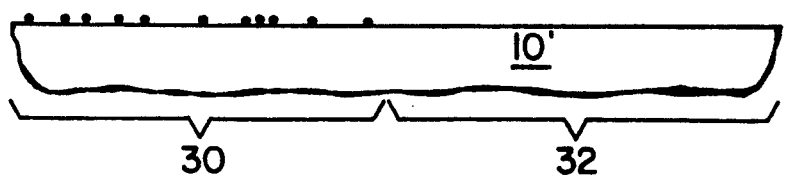

Specifically, as shown in FIG. 2A, a thin coat of resist 28 is applied over the oxide particles 16' on the silicon substrate 10'. The resist 28 is exposed with a blocking mask and developed, such that the array region 32 is uncovered and the field region 30 is covered. A short 10:1 buffered HF dip (or other suitable etch) is used to remove the oxide particulates from the array region 32 as shown in FIG. 2B. The resist is then stripped using standard processing, leaving the silicon substrate 10' with the oxide particles 16' over the field region 30. The resulting structure then proceeds to be treated according to the process shown in FIG. 1E-FIG. 1I. If the adhesion of the oxide particles becomes a problem, a blanket expose and develop could also be used.

EXAMPLE 3

FIG. 3 illustrates a further embodiment of the planarization process of the subject invention. A silicon substrate 34 is again provided which has a layer of pad oxide 36, or nitride, thereon (see FIG. 3A). Initially, a thin layer of positive photoresist 38 is applied over the pad oxide 36, as shown in FIG. 3B. The entire wafer is then exposed to diffuse radiation 40 as shown in FIG. 3C. Suitable diffuse radiation sources include an Alpha particle generator or an attenuated ion beam source. The energy of the source and the sensitivity of the photoresist must be matched in such a way that an individual particle will completely expose a small area 42, on the order of 50 to 500 Angstroms in diameter. The total dose should be on the order of 1 to 10 particles per square micron.

Figure 3A:
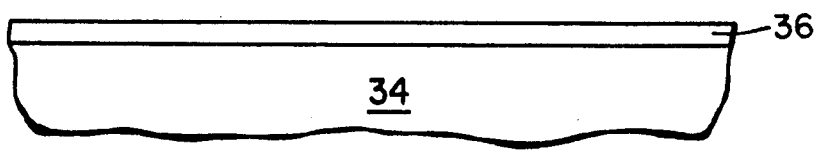
FIG. 3A–3H are cross-section side elevational views of a further embodiment of the planarization process according to the subject invention.
Figure 3B:
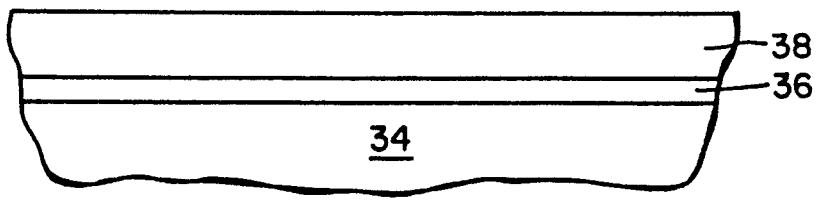
Figure 3C:
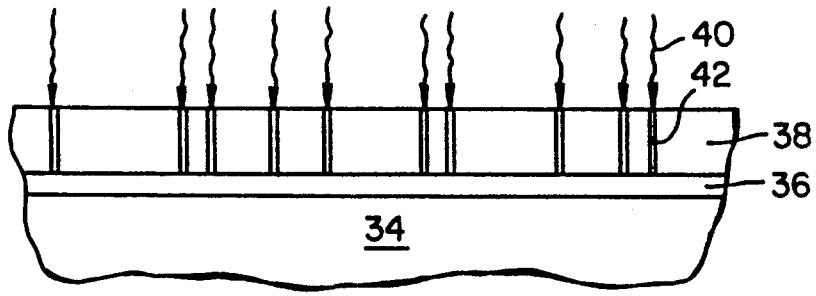
Figure 3D:
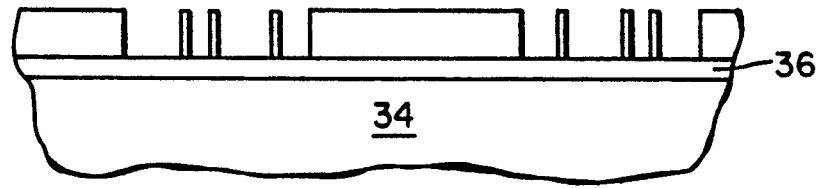
Figure 3E:
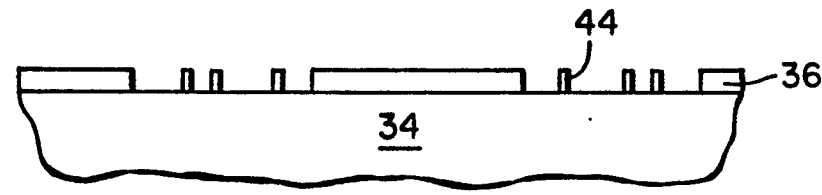
Figure 3F:
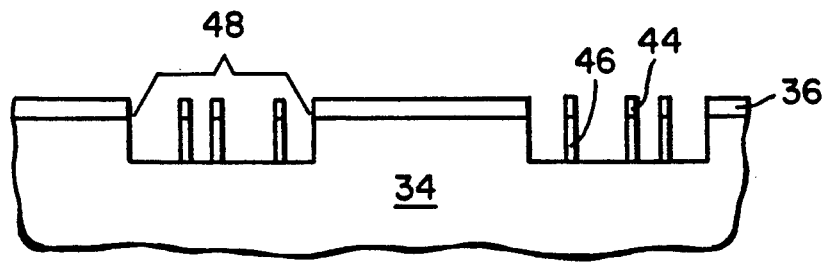

As shown in FIG. 3D, the entire wafer is then exposed using a negative version of a standard isolation trench mask, and the positive resist is developed according to standard procedures. This leaves a "mask" for etching the pad oxide 36. As shown in FIG. 3E, the pad oxide 36 (or nitride) is then etched. This pad oxide 36 (or nitride) will function as a nonerodable mask for trench etching, and includes cap micromasks 44 formed from the pad oxide 36. The trenches 48 are then etched as shown in FIG. 3F. Thin silicon pillars 46 will form under the cap micromasks 44.

Figure 3G:
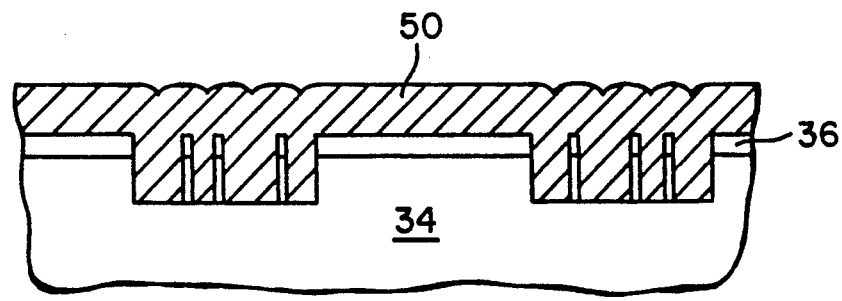

The silicon pillars 46 are then oxidized, and the trenches 48 are filled with a conformal oxide 50 as shown in FIG. 3G. An example of a suitable conformal oxide is CVD TEOS. The oxide pillars will be growth sites, yielding an essentially planar surface before CMP planarization. This is true even if there are trenches of different depths on the same chip.

Figure 3H:
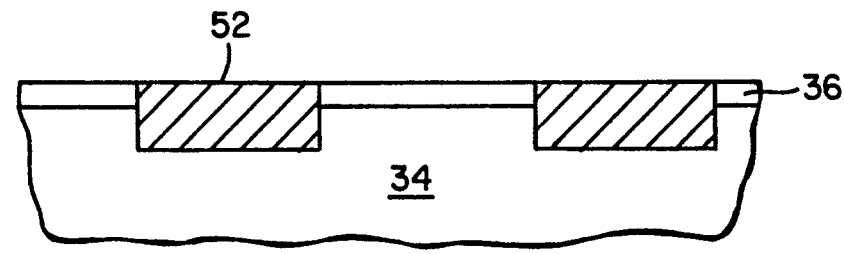

The resulting conformal oxide is then planarized by suitable means, for example chemical-mechanical polishing (CMP) is used to form a planarized surface 52 as shown in FIG. 3H.

EXAMPLE 4

FIG. 4 illustrates a planarization process according to the subject invention in which a metal fill is utilized. As shown in FIG. 4A, the initial structure includes a silicon substrate 54, a pad oxide 56, a polyimide insulator 58, and a siloxane mask/polish stop 60. A thin layer of nitride 62 is deposited as shown in FIG. 4B, upon which a layer of standard resist 64 is applied (see FIG. 4C) and exposed/developed for a metal pattern. The thin nitride 62 is then opened with suitable etching techniques as shown in FIG. 4D, resulting in the structure shown in FIG. 4E.

Figure 4A:
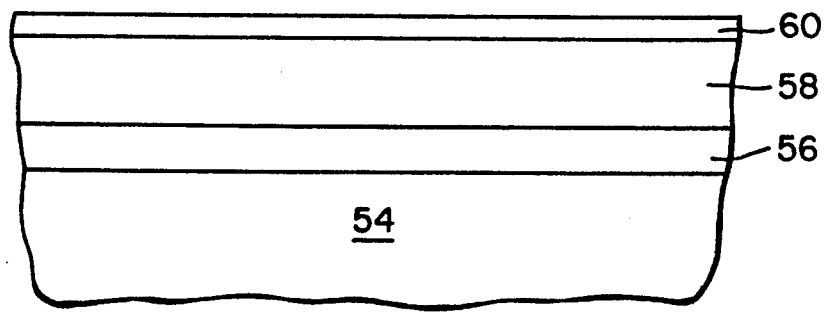
FIG. 4A–4M are cross-section side elevational views of an additional embodiment of the planarization process according to the subject invention.
Figure 4B:
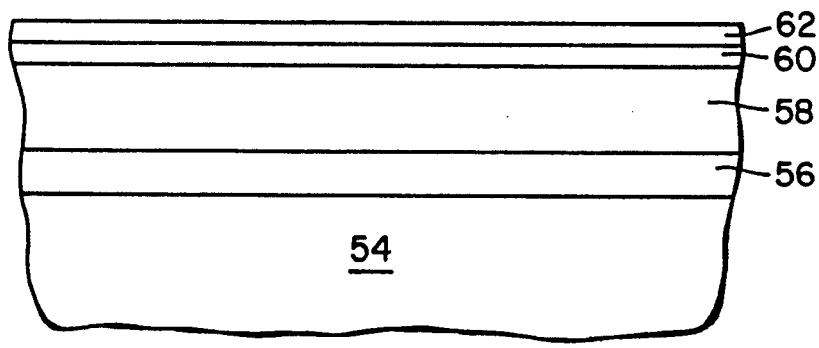
Figure 4C:
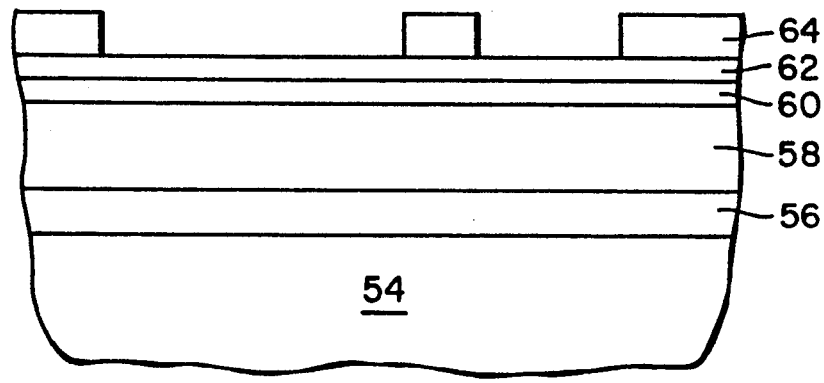
Figure 4D:
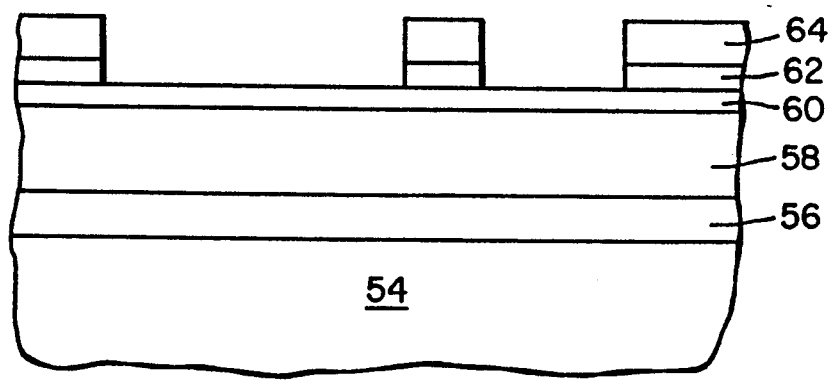
Figure 4E:
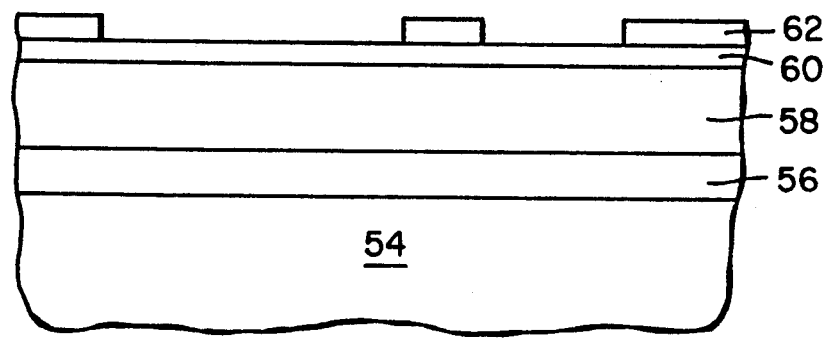
Figure 4F:
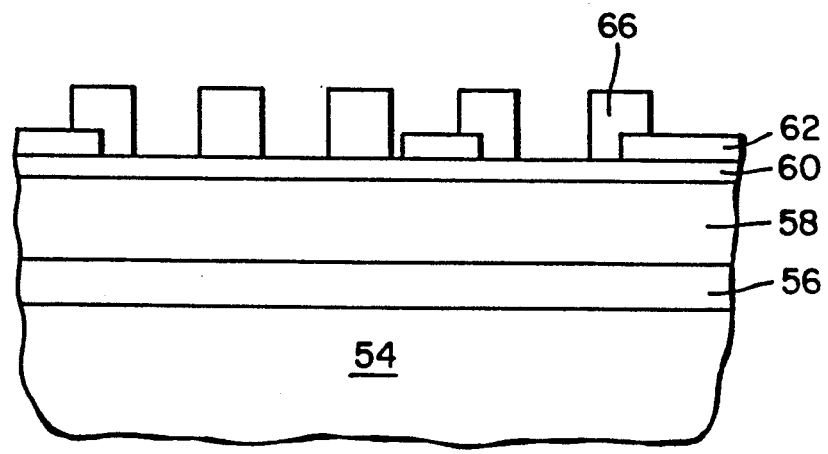
Figure 4G:
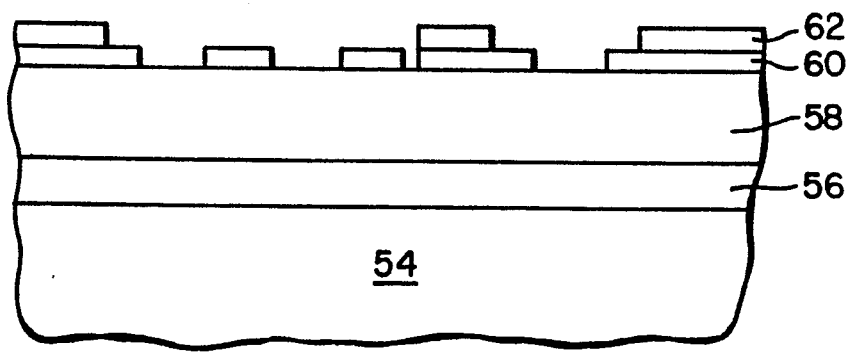
Figure 4H:
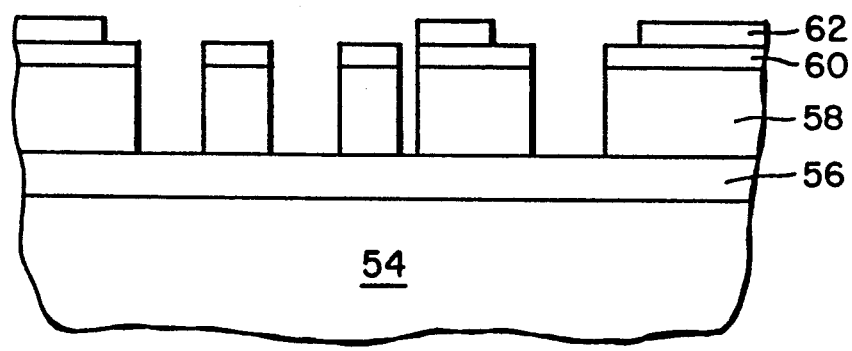
Figure 4I:
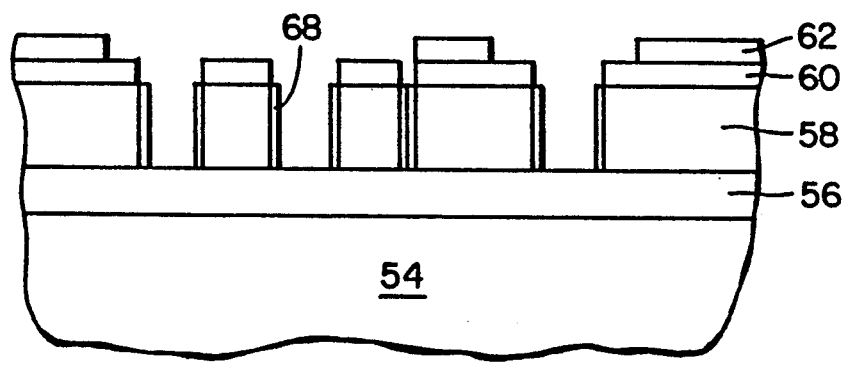

A second thin coat of resist 66 is then applied, which is exposed using a mask consisting exclusively of parallel minimum lines on minimum pitch. After the resist is developed, the siloxane previously exposed by the nitride open is etched (see FIG. 4F) and the resist is removed (see FIG. 4G). As shown in FIG. 4H, the polyimide is then etched to form vertical sidewalls. The polyimide reactive ion etch (RIE) is continued to remove any remaining resist. A thin conformal CVD coating is then deposited, using the same material that is eventually to fill the trenches. Alternatively, polysilicon can be used if the desired fill material is a metal silicide. RIE etch is then utilized to leave thin sidewall spacers 68 as shown in FIG. 4I.

Figure 4J:
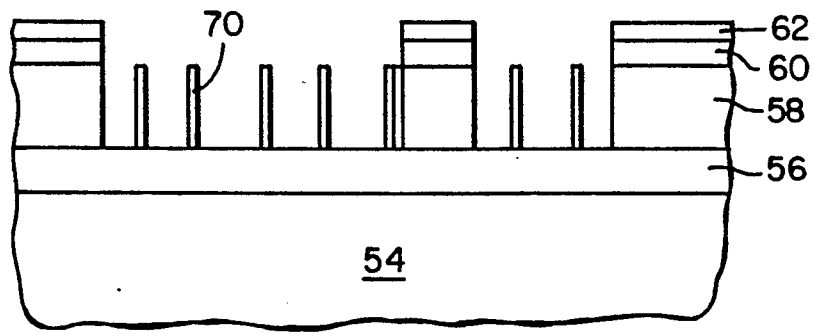
Figure 4K:
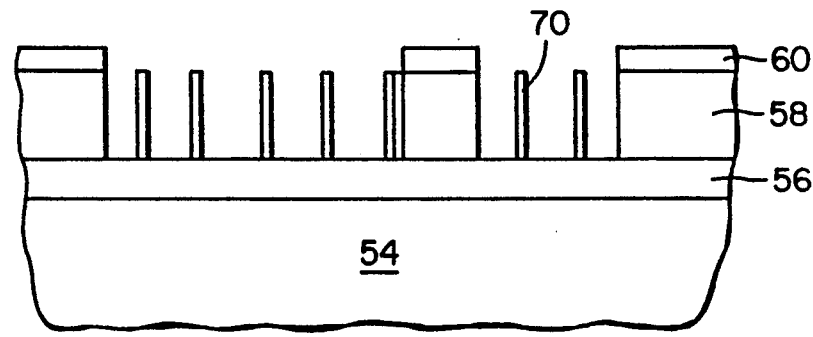
Figure 4L:
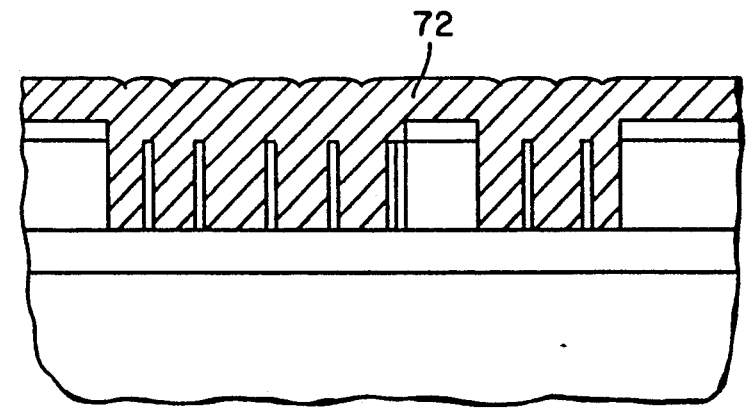

The remaining siloxane 60 that is not covered by nitride is then etched. If sidewalls are not vertical, a small isotropic etch component may be necessary to remove all polyimide from behind the sidewall spacers. This leaves a regular pattern of subminimum features (metal stringers or pillars) 70 in the trenches as shown in FIG. 4J. The nitride 62 is then removed prior to deposition of CVD metal 72 to fill the trenches (see FIG. 4L). The metal stringers will be nucleation sites for the metal growth, yielding a generally planar structure before CMP planarization/etchback. In addition, the thickness of metal required to completely fill such a trench of any depth is about one-half the minimum image. This reduces the overburden to be polished and simplifies the planarization process.

Figure 4M:
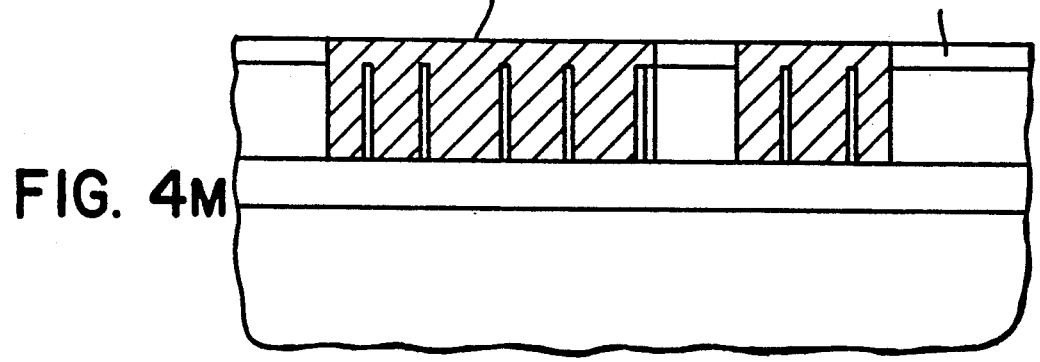

The resulting structure is planarized by suitable means, for example by chemical-mechanical polishing (with a soft polishing pad for improved global uniformity), stopping on the siloxane 60, to form a planarized surface 74 (see FIG. 4M).

While the invention has been particularly shown and described with reference to preferred embodiments thereof, it will be understood by those skilled in the art that various changes in form and details may be made therein without departing from the spirit and scope of the invention.

We claim:

1. A method of planarizing over a recessed area of a semiconductor structure, said method comprising:
   a) forming pillars and a recessed area on a semiconductor structure, said semiconductor structure having a surface thereof adjacent said recessed area, said pillars being formed within said recessed area, wherein said pillars are less than the minimum feature size that can be formed for said semiconductor structure;
   b) depositing a layer of fill over said pillars, said recessed area, and said surface, said pillars preventing substantial depression of said layer of fill overlying said recessed area relative to said surface; and
   c) planarizing said layer of fill by chemical-mechanical polishing wherein a second surface of said planarized layer of fill is thereby substantially planar with said surface of said semiconductor structure.

2. The method of claim 1 wherein the density of said pillars comprises one to ten pillars per square micron.

3. The method of claim 1 wherein said pillars are randomly placed.

4. The method of claim 1 wherein said pillars are non-randomly placed.

5. The method of claim 1 wherein said pillars are oxidized prior to depositing said layer of fill.

6. The method of claim 1 wherein said recessed area comprises a trench.

7. The method of claim 1 wherein said deposition of said layer of fill comprises chemical vapor deposition.

8. The method of claim 1 wherein said fill comprises a conformal oxide.

9. The method of claim 1 wherein said fill comprises a conductor.

10. The method of claim 9 wherein said conductor comprises a metal.

11. The method of claim 9 wherein said conductor comprises a semiconductor.

12. The method of claim 1 wherein said formation of said pillars and said recessed area comprises:
   a) forming a micromask on a surface of a semiconductor structure; and
   b) selectively removing the structure surrounding the micromask so as to form a recessed area, wherein remaining unremoved portions of said structure beneath said micromask form said pillars.

13. The method of claim 12 wherein said micromask comprises particles.

14. The method of claim 13 wherein said forming of said micromask comprises:
   a) applying a solution of particles in a solvent to the surface; and
   b) evaporating said solvent, thereby leaving said particles on said surface.

15. The method of claim 13 wherein said particles comprise oxide particles.

16. The method of claim 12 wherein said micromask comprises an insulator.

17. The method of claim 16 wherein said insulator comprises nitride.

18. The method of claim 16 wherein said forming of said micromask comprises etching an insulator layer overlying said surface, so as to form subminimum insulator areas thereon, said subminimum insulator areas comprising said micromask.

19. The method of claim 18 wherein said etching of said insulator layer utilizes photoresist exposed to diffuse radiation.

20. The method of claim 1 wherein said formation of said pillars and said recessed area comprises:
   a) selectively removing portions of a semiconductor structure from an area to be recessed;
   b) forming sidewalls within said area to be recessed; and
   c) selectively removing semiconductor structure remaining in said area to be recessed, leaving said sidewalls therein, said remaining sidewalls forming said pillars in said formed recessed area.

21. A method of planarizing over a recessed area of a semiconductor structure, said method comprising:
   a) forming pillars and a recessed area on a semiconductor structure, said semiconductor structure having a surface thereof adjacent said recessed area, said pillars being formed within said recessed area;
   b) depositing a layer of fill over said pillars, said recessed area, and said surface, wherein said pillars are formed with pre-selected spacing and cross-sectional dimensions so as to prevent substantial depression of said layer of fill overlying said recessed area, and wherein said pre-selected spacing is such that the density of said pillars comprises one to ten pillars per square micron; and
   c) planarizing said layer of fill by chemical-mechanical polishing wherein a second surface of said planarized layer of fill is thereby substantially planar with said surface of said semiconductor structure.

* * * * *